(12) United States Patent
Wada et al.

(10) Patent No.: US 8,609,444 B2
(45) Date of Patent: Dec. 17, 2013

(54) MANUFACTURING METHOD OF MOUNTING PART OF SEMICONDUCTOR LIGHT EMITTING ELEMENT, MANUFACTURING METHOD OF LIGHT EMITTING DEVICE, AND SEMICONDUCTOR LIGHT EMITTING ELEMENT

(75) Inventors: Satoshi Wada, Aichi-ken (JP); Miki Moriyama, Aichi-ken (JP); Koichi Goshonoo, Aichi-ken (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 669 days.

(21) Appl. No.: 12/659,073

(22) Filed: Feb. 24, 2010

(65) Prior Publication Data

US 2010/0219444 A1 Sep. 2, 2010

(30) Foreign Application Priority Data

Feb. 27, 2009 (JP) ................................ P2009-045779
Nov. 18, 2009 (JP) ................................ P2009-263108

(51) Int. Cl.
*H01L 21/00* (2006.01)
(52) U.S. Cl.
USPC ...................... 438/26; 438/455; 257/E21.508
(58) Field of Classification Search
USPC ................. 438/25, 26, 40, 455; 257/E21.508
See application file for complete search history.

(56) References Cited

U.S. PATENT DOCUMENTS

| 6,057,168 | A | 5/2000 | Seyama et al. |
| 7,417,220 | B2 | 8/2008 | Suehiro et al. |
| 8,017,967 | B2 | 9/2011 | Suehiro et al. |
| 8,033,016 | B2 * | 10/2011 | Hibino et al. ............... 29/852 |
| 2006/0049335 | A1 | 3/2006 | Suehiro et al. |
| 2006/0284321 | A1 | 12/2006 | Wu et al. |
| 2007/0012939 | A1 | 1/2007 | Hwang et al. |
| 2008/0135283 | A1 | 6/2008 | Hibino et al. |
| 2008/0252212 | A1 | 10/2008 | Suehiro et al. |
| 2009/0140282 | A1 | 6/2009 | Wu et al. |

FOREIGN PATENT DOCUMENTS

| JP | 11-297735 A | 10/1999 |
| JP | 11-297890 A | 10/1999 |
| JP | 2002-118137 A | 4/2002 |
| JP | 2006-128457 A | 5/2006 |
| JP | 2006-313884 A | 11/2006 |
| JP | 2007-19144 A | 1/2007 |
| JP | 2008-226864 A | 9/2008 |
| WO | WO2006/112384 A1 | 10/2006 |

OTHER PUBLICATIONS

Japanese Office Action dated Dec. 18, 2012 and English Translation Thereof.

* cited by examiner

*Primary Examiner* — Jack Chen
(74) *Attorney, Agent, or Firm* — McGinn IP Law Group, PLLC

(57) ABSTRACT

A manufacturing method of a mounting part of a semiconductor light emitting element comprising: preparing a semiconductor light emitting element including an electrode which has a surface, and a board which has a surface; forming a plurality of bump material bodies on at least one of the surface of the electrode and the surface of the board by shaping bump material into islands, wherein the bump material is paste in which metal particles are dispersed, a top surface and a bottom surface of the bump material bodies have different areas, and the top surface is practically flat; solidifying the bump material bodies by thermally processing the bump material bodies; and fixing the semiconductor light emitting element and the board through the bumps.

7 Claims, 10 Drawing Sheets

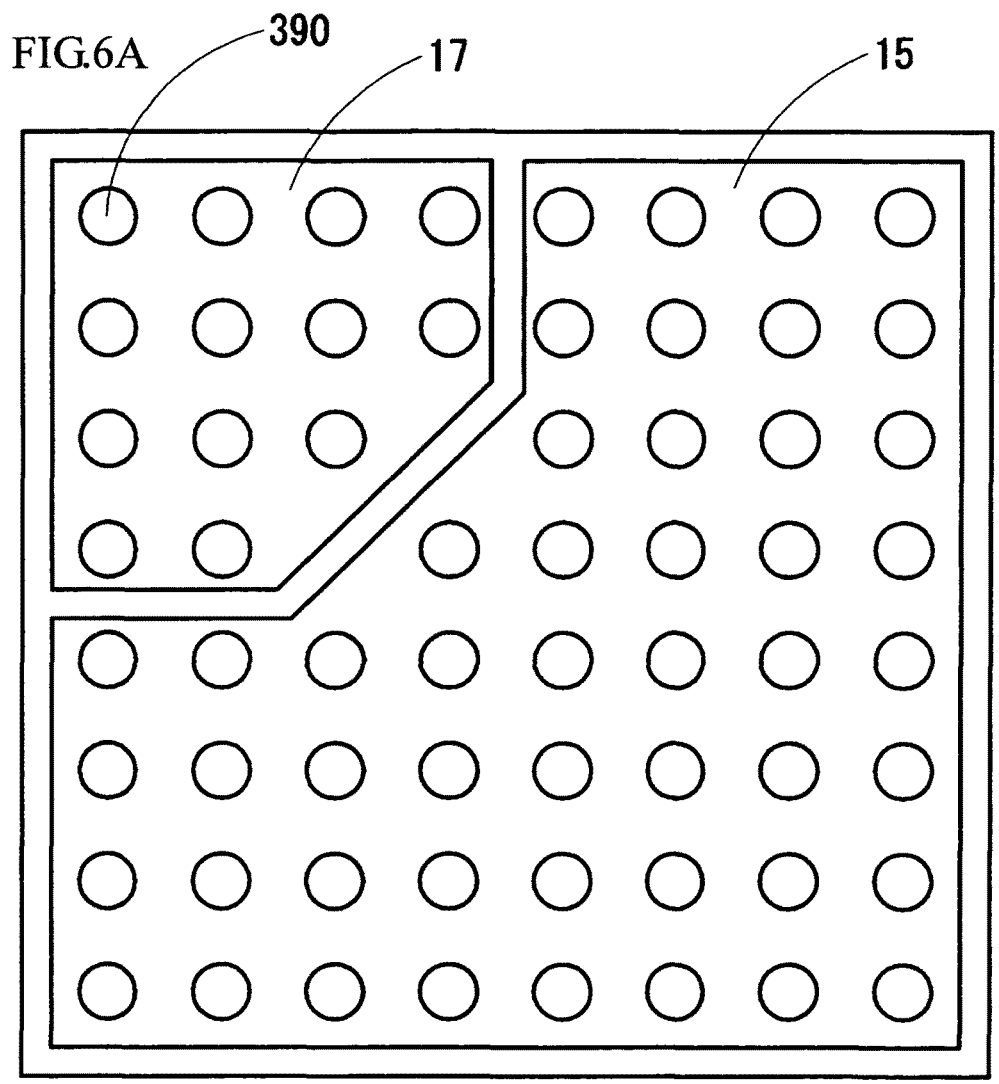

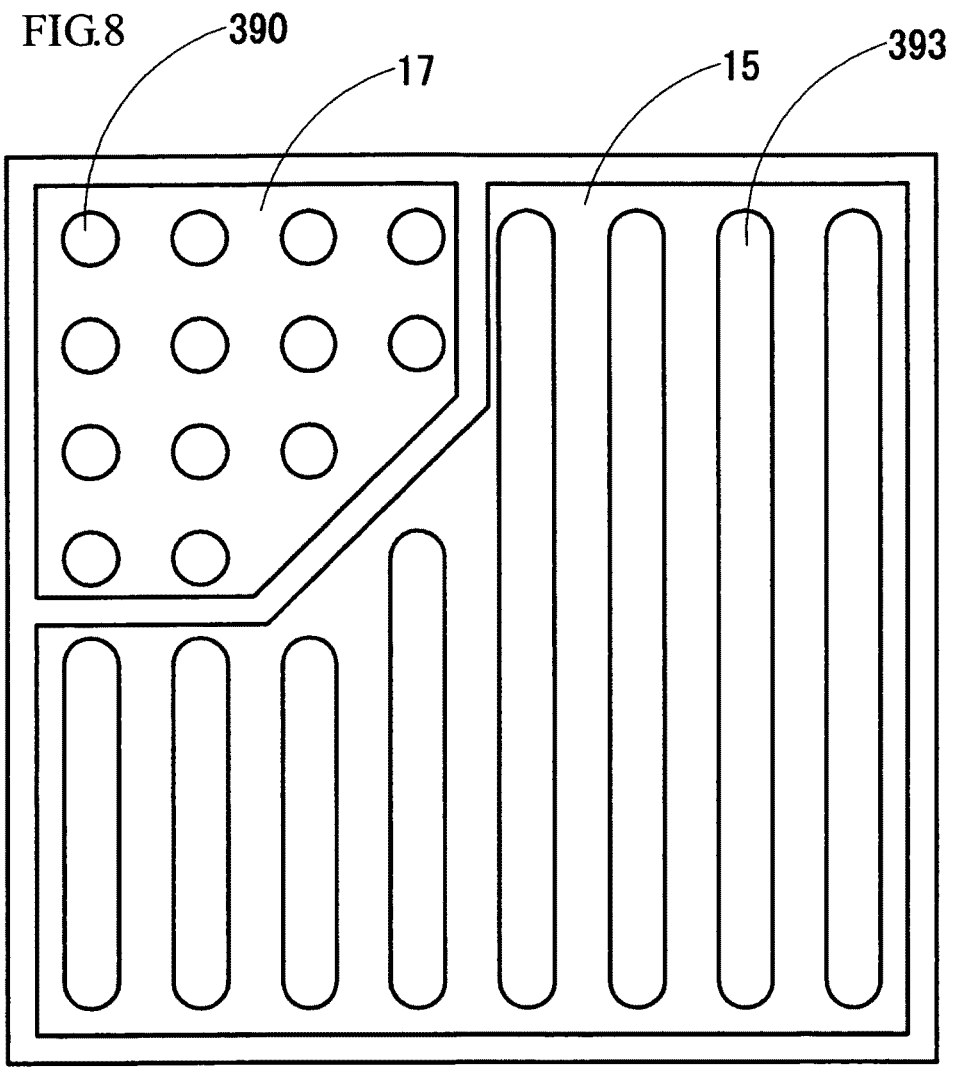

MANUFACTURING METHOD OF MOUNTING PART OF SEMICONDUCTOR LIGHT EMITTING ELEMENT, MANUFACTURING METHOD OF LIGHT EMITTING DEVICE, AND SEMICONDUCTOR LIGHT EMITTING ELEMENT

CROSS-REFERENCE TO RELATED APPLICATIONS

The present application claims priority from Japanese Patent Application No. 2009-045779 filed on Feb. 27, 2009 and Japanese Patent Application No. 2009-263108 filed on Nov. 18, 2009. The latter one claims Japanese domestic priority from the former one. The subject matter of these applications is incorporated herein by reference.

TECHNICAL FIELD

The present invention relates to an improvement of a bump for fixing a semiconductor light emitting element onto a board.

BRIEF DESCRIPTION OF RELATED ART

A so called flip-chip type light emitting element is mounted on a board while a surface of the light emitting element, on which a pair of electrode is provided, faces the board. When a flip-chip type light emitting element is mounted on the board, the light emitting element and the board is generally combined by bumps. In this case, the bumps are piled on a surface of a pair of electrodes of the light emitting element.

There are three related methods for forming the bumps: electroplate, sputtering, and stud bumps. These methods, however, have disadvantages. In a case of electroplate, the light emitting element may be possibly damaged since electrical current through the element is inevitable. In a case of sputtering, a manufacturing throughput is deteriorated due to slow bump piling speed. In a case of stud bumps, a manufacturing throughput is deteriorated since each bump has to be formed individually.

In order to avoid above described disadvantages, a plane like bump 5 is formed by screen printing a paste material 1 on a predetermined region of the electrode surface 2, a thermal process, and removing a resist 3. The paste material 1 includes metal particles and is called in this specification as a bump material.

References for the related art are JP-A-2007-019144 and JP-A-2008-226864.

SUMMARY

The inventors of the present invention found the following disadvantage during industrious investigations about the usage of the bump material for fixing a semiconductor light emitting element to a board.

The bump material 1 is paste or slurry and, therefore, has fluidity. When the bump material 1 is screen printed on the electrode surface 2, a center of the bump material 1 recesses as a meniscus of fluidity of the bump material 1 driven by a surface tension (FIG. 1A). After the thermal process, the recessed shape of the bump material 1 is kept (FIG. 1B).

When the semiconductor light emitting element and the board are hot-pressed with the bump 5 therebetween, the press-load is concentrated on a protruded portion of the bump 5 rather than uniformly applied. This non-uniform press-load causes random deformation of the bump 5 and, therefore, an unevenness in bonding between the light emitting element and the board. As a result, there is a possibility that a bonding area is insufficient, a bonding strength is insufficient, and heat dissipation characteristic of the semiconductor light emitting element is deteriorated.

Exemplary embodiments of the present invention address above described disadvantages and may address disadvantages not described above. The first aspect of the exemplary embodiments of the present invention is a manufacturing method of a mounting part of a semiconductor light emitting element comprising: preparing a semiconductor light emitting element including an electrode which has a surface, and a board which has a surface; forming a plurality of bump material bodies on at least one of the surface of the electrode and the surface of the board by shaping bump material into islands, wherein the bump material is paste in which metal particles are dispersed, a top surface and a bottom surface of the bump material bodies have different areas, and the top surface is practically flat; solidifying the bump material bodies by thermally processing the bump material bodies; and fixing the semiconductor light emitting element and the board through the bumps.

According to the above described first aspect of the exemplary embodiments, since the bump material bodies are islands, each bump has small diameter, the area of the top surface and the area of the bottom surface are different, and the top surface is practically flat, the press-load is concentrated on one of the top surface and the bottom surface having smaller surface area while hot-pressing the semiconductor light emitting element and the board through the bumps. In this case, since the top surface of the bump is practically flat, the press-load is uniformly applied and does not have any negative effects on the deformation of the small area portion of the bump. In this exemplary embodiment, the phrase "practically flat" means that the unevenness of the top surface is smaller at least than the deformation amount of the bump in height by the hot press.

The bump is deformed from the small area portion in all-round directions when the press-load concentrates on the small area portion. As a result, a sufficient bonding area between the semiconductor light emitting element and the board is obtained. The deformed bumps are sometimes combined each other. This fusion of the bumps improves the thermal conductivity.

The bump may have a shape that gradually reduces or increases its width along its height (a direction from the bottom surface to the top surface). Also, the bump may have a shape that includes a portion where gradually reduces its width along its height and a portion where gradually increase its width along its height. The bump shape preferably has a trapezoidal vertical cross section, such as conical trapezoid and a stripe with trapezoidal cross section.

According to another aspect of the exemplary embodiments of the present invention according to the first aspect, the plurality of the bump material bodies are formed with a mask covering at least one of the surface of the electrode and the surface of the board, the mask includes a plurality of openings which are tapered in a thickness direction of the mask, and the bump material is filled into the openings.

Since the bump material bodies are shaped with the mask, the shape of each bump material body is securely stable. Also a process forming the bump material bodies are fast-acting and performed at a low cost.

According to another aspect of the exemplary embodiments of the present invention according to the first aspect, the mask is a resist. Since the mask is made from a resist, it is easy to remove the mask and the process forming the bump material bodies are fast-acting.

According to another aspect of the exemplary embodiment of the present invention according to the first aspect, the bump material is filled into the openings from an upper surface of the mask by screen printing. Since the bump material is filled into the openings by screen printing, the process forming the bump material bodies are fast-acting, and the through put of the process fixing the semiconductor light emitting element to the board is improved.

According to another aspect of the exemplary embodiment of the present invention according to the first aspect, the bump material includes a thermoplastic sealant, and a manufacturing method of a mounting part of a semiconductor light emitting element comprising: sealing the semiconductor light emitting element by hot pressing the semiconductor light emitting element and the board. According to this method, the bonding between the semiconductor light emitting element and the board and the sealing by the thermoplastic sealant are performed simultaneously, by arranging the semiconductor light emitting element on the board and hot pressing. Therefore the through put of the process is improved. Especially, as the thermoplastic sealant, low melting point glass is preferable.

The second aspect of the exemplary embodiments of the present invention is a manufacturing method of a mounting part of a semiconductor light emitting element comprising: preparing a semiconductor light emitting element including an electrode, and a board including a surface; forming a plurality of bump material bodies on at lease one of a surface of the electrode and the surface of the board by shaping bump material into islands, wherein the bump material is paste in which metal particles are dispersed, and a width of the bump material bodies changes along a height direction thereof; solidifying the bump material bodies by thermally processing the bump material bodies; fixing the semiconductor light emitting element and the board through the bumps.

According to the second aspect of the exemplary embodiments, since the bump material bodies are formed so that the width of the bump material bodies change its width along its height direction, the press-load concentrates on the portion with a small width and thus formed bump material bodies are deformed in all-round direction from the small width portion. As a result, the sufficient bonding area between the semiconductor light emitting element and the board is obtained. The deformed bumps are sometimes combined each other. This fusion of the bumps improves the thermal conductivity.

According to another aspect of the second aspect of the exemplary embodiments, the width of the bump material bodies gradually reduces along the height direction while departing from at least one of the surface of the semiconductor light emitting element and the surface of the board where the bump material bodies are formed. Since such a shape of the bump materials is easy to shape (or mold), the through put of the process is improved.

BRIEF DESCRIPTION OF DRAWINGS

FIG. 6A is a plan view showing bumps formed on the electrode surface of the semiconductor light emitting element according to the second exemplary embodiment.

FIG. 8 shows a modification of the second exemplary embodiment. FIG. 8 is a plan view showing bumps formed in a dot shape and in a stripe shape on the electrode surface of the semiconductor light emitting element.

DESCRIPTION OF EXEMPLARY EMBODIMENTS

Figure 1A:
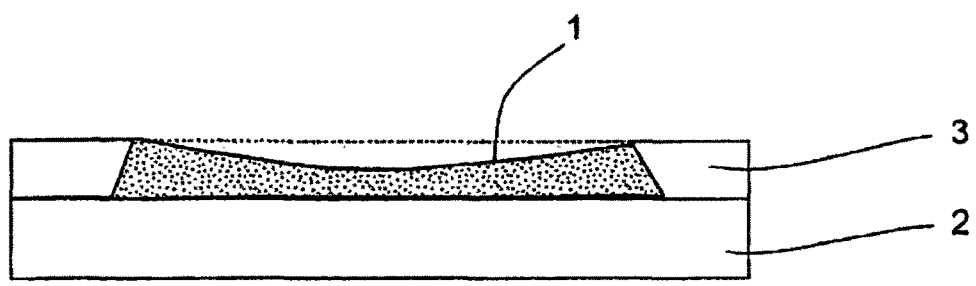
FIG. 1 is a cross sectional view showing a characteristic of the related bump material.
Figure 1B:
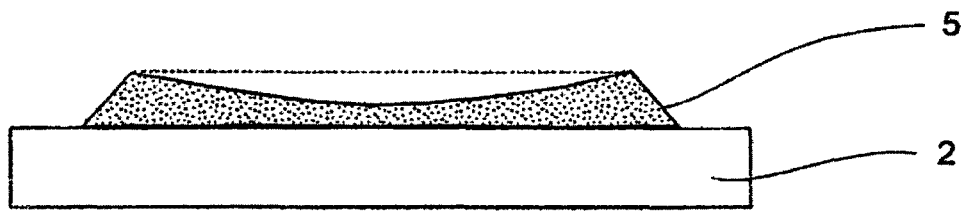

In an exemplary embodiment of the present invention, a flip-chip type group III nitride semiconductor light emitting element is adopted as a semiconductor light emitting element. The flip-chip type light emitting element is provided with a P-layer and a N-layer formed on an insulator substrate and a P-electrode and a N-electrode on one surface thereof. Also, a group III nitride semiconductor light emitting element, which is provided with a P-electrode on one surface thereof and a N-electrode on the other surface thereof, may be adopted. The group III nitride semiconductor light emitting element has an active layer made from group III nitride composite semiconductors. The group III nitride composite semiconductors are described by a general formula of quarternary composite $Al_xGa_yIn_{1-x-y}N$ ($0 \le x \le 1$, $0 \le y \le 1$, $0 \le x+y \le 1$). The general formula includes binary composites AlN, GaN, and InN, and ternary composites $Al_xGa_{1-x}N$, $Al_xIn_{1-x}N$, and $Ga_xIn_{1-x}N$. At least a part of group III element may be substituted by boron (B), thallium (Tl), or the like. Also, at least a part of nitrogen (N) may be substituted by phosphorus (P), arsenic (As), antimony (Sb), bismuth (Bi), or the like. Also, the group III nitride composite semiconductors may contain any kind of impurities. Examples of P-type impurity are Si, Ge, Se, Te, C, or the like. Examples of N-type impurity are Mg, Zn, Be, Ca, Sr, Ba, or the like. A sapphire substrate ($Al_2O_3$), a gallium nitride substrate (GaN), a silicon carbide substrate (SiC), and a silicon substrate (Si) may be used as a crystal growth substrate for the group III nitride composite semiconductors.

The group III nitride composite semiconductor layer is formed by metal organic chemical vapor deposition (MOCVD), molecular beam epitaxy (MBE), halide vapor phase epitaxy (HVPE), sputtering, ion plating, electron shower, or the like.

An electron beam radiation, plasma radiation, or annealing in a furnace for group III nitride composite semiconductors after doping P type impurity is possible, but is not mandatory.

An light emitting element is formed by stacking the group DI nitride composite semiconductor layers. Examples of the layered structure for light emission are a quantum well structure (multi-quantum well structure or single quantum well structure), a single hetero-junction, a double hetero-junction, or a homo-junction.

Since the flip-chip type light emitting element emits light from the substrate side thereof and the wirings on the board and the upper surface of the light emitting element, on which the P-electrode and the N-electrode are provided, are fixed by the bumps. The bumps are required conductivity, thermal conductivity, and mechanical strength. Especially, mechanical strength is necessary to strongly bond the light emitting element and the board.

The bumps are formed on the surface of the electrodes of the semiconductor light emitting element and/or on the surface of the electrodes of the board. More specifically, the bumps are formed on the P-electrode and N-electrode of the semiconductor light emitting element and/or on the wiring pads of the board.

Figure 2:
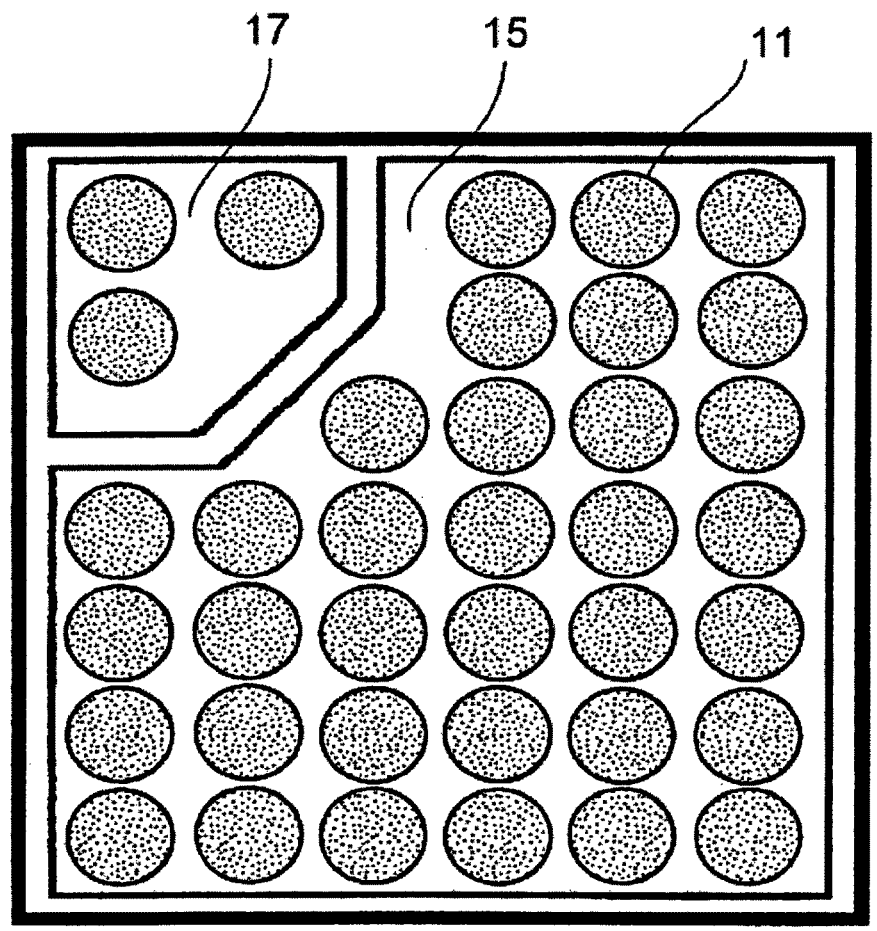
FIG. 2 is a plan view showing bumps formed in a dot array manner on an electrode surface of the semiconductor light emitting element.
Figure 3:
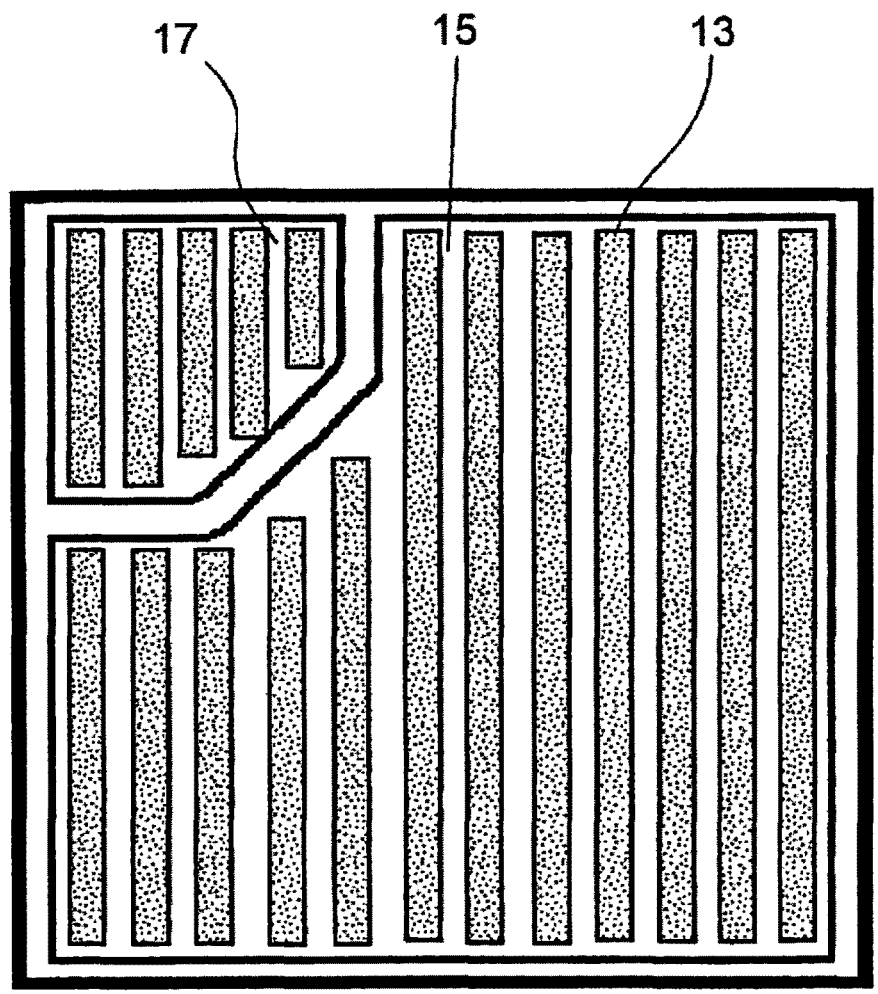
FIG. 3 is a plan view showing bumps formed in a stripe shape on an electrode surface of the semiconductor light emitting element.

The bumps are formed as islands each of which has a space between adjacent other bumps. The island shape of the bumps may be a dot (bump 11, FIG. 2), a stripe (bump 13, FIG. 3), or the like. It is preferable to uniformly arrange the bumps on the electrodes of the semiconductor light emitting element (P-electrode 15, N-electrode 17) and/or the wiring pads of the board. Also, it is possible to arrange the bumps non-uniformly and make the bumps in shape defined by a free curve.

In the exemplary embodiments of the present invention, an area of the top surface of the bump and an area of the bottom surface of the bump are different. As a result of this are difference, a stress concentrates on the small area portion of the bump and a deformation starts therefrom during the hot press. The stress concentration onto contact portions, where the semiconductor light emitting element and the bumps or the board and the bumps contact each other, makes the bonding easy. If all bumps have a same shape, each bump deforms in a same manner from the small area portion thereof and the bump is uniformly filled in a space between the semiconductor light emitting element and the board. In other words, a bump density in the bonding plane of the semiconductor light emitting element and the board is uniform. The shape of the bumps and the arrangement of the bumps may be modified depending on the bump shape, and the shapes and the deformations of the semiconductor light emitting element and the board.

Although a size and a pitch (a size of the space between the adjacent bumps) of the bumps may be arbitrarily determined, such a size and a pitch are preferable that a volume of the bump deformed during the hot press is substantially equal to a volume of the space between the bumps. Accordingly, the bumps spread over the whole surface of the semiconductor light emitting element and the board, and a strong bonding between the semiconductor light emitting element and the board is obtained.

The bump is obtained by thermal processing a bump material body. Since the bump material has fluidity, a meniscus is caused when the surface of the bump material is large (as shown in FIG. 1A). Therefore, in this exemplary embodiment, the bump had an area of the top surface so as not to cause the meniscus. Therefore, it is preferable to make the bump so that the area of the top surface of the bump is small and the area of the bottom surface of the bump is large. In a case where the top surface of the bump is circle (dot shaped bump), the diameter of the bump is 3~7 μm in order to prevent the meniscus. Also, in a case where the top surface of the bump is a rectangular (stripe shape bump), the width of the short direction of the bump is 3~7 μm in order to prevent the meniscus.

It is preferable to use a mask in order to shape the bump material body with fluidity into a conical shape, for example. The mask has an opening and a peripheral wall of the opening defines the peripheral surface of the bump material body. By using the mask, it is possible to arbitrarily design the shape and arrangement density of the bump material bodies. Materials for the mask may be arbitrarily adopted. It is preferable to adopt a resist because a tapered mask is easily formed by the resist. For example, a metal film, a resist, or the like may be adopted.

As the bump material, slurry including metal particles dispersed in organic solvent may be adopted. An elemental substance of gold, silver, platinum, palladium, or the like and mixtures of more than two of them are used as the metal particles. Alcohol may be used as the organic solvent. Examples of the alcohol are ester, terpineol, pine oil, butyl carbitol acetate, butyl carbitol, carbitol, and the like. As a preferable organic solvent of ester series is 2,2,4,-trimethyl-3-hydroxypentaisobutyrate ($C_{12}H_{24}O_3$).

For the purpose of dispersion of the metal particles, polymer may be added to the organic solvent. Examples of the polymer are acrylic resin such as methyl methacrylate polymer, cellulosic resin such as ethyl cellulose, alkyd resin such as phthalic anhydride resin.

Also the metal particles may be dispersed in a thermoplastic resin. Examples of the thermoplastic resin are olefin resin, vinyl resin including halogen (such as polyvinyl chloride, fluoride resin), acrylic resin, styrene resin, polycarbonate resin, polyester resin (such as polyethylene telephthalate, polybuthylene telephthalate), polyacetal resin, polyamide resin, polyphenylene sulfide resin, polyimide resin, polyether ketone resin, thermoplastic elastomer, or the like. Such thermoplastic resins are used in elemental substance or mixtures of more than two of them.

The thermal process of the bump material body removes the organic solvent from the bump material body and drives the fusion of the metal particles. The condition of the thermal process is suitably adjusted depending on what the bump material is and depending on the size of the bump material body.

In the exemplary embodiment, the group III nitride semiconductor light emitting element may have a P-electrode on one surface of the conductive substrate and has a N-electrode on the other surface of the conductive substrate. When such a semiconductor light emitting element is used, the bumps are formed one of the surface of the P-electrode and the N-electrode. Then the surface on which the bumps are formed faces the wiring board and the semiconductor light emitting element is hot pressed. Also, the semiconductor light emitting element is hot pressed after forming the bumps on the wiring board.

In the exemplary embodiments of the present invention, the bumps are formed so as to change the width along its height direction. Examples of method to form the bump material body in this manner are dot printing, transfer printing by a dispenser, needle application, anastatic printing, gravure printing, offset printing, inkjet printing, nano-inprint, or the like. The thermal treatment process (provisional calcination) for the bump material and the bump material body are performed by the above described methods. Also, the provisional calcinations may be omitted depending on the semiconductor element condition on which the bumps are formed.

First Exemplary Embodiment

The first exemplary embodiment of the present invention is explained below with reference to the drawings.

Figure 4A:
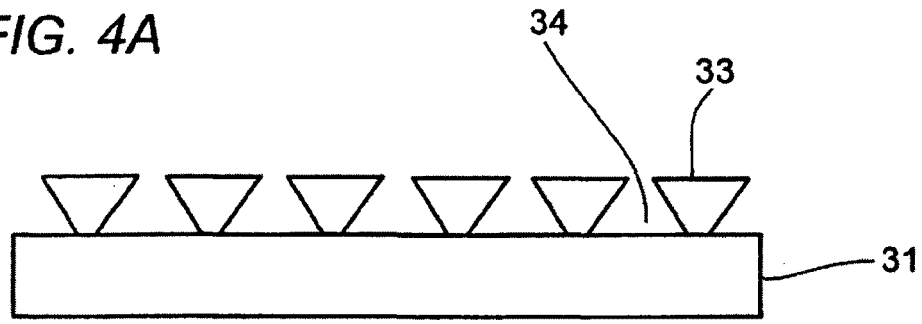
FIGS. 4A to 4D show a manufacturing process for the bumps according to the first exemplary embodiment.

A resist 33 is applied on the surface of the electrode 31 of the semiconductor light emitting element. Then, a plurality of dot holes (circular holes) 34 are uniformly formed on the resist 33. As shown in FIG. 4A, the cross section of each dot hole is preferably a trapezoidal shape. (the inner surface of the resist 33 is reversely tapered in the thickness direction of the resist 33). In this exemplary embodiment, the resist 33 is a negative-resist.

Figure 4B:
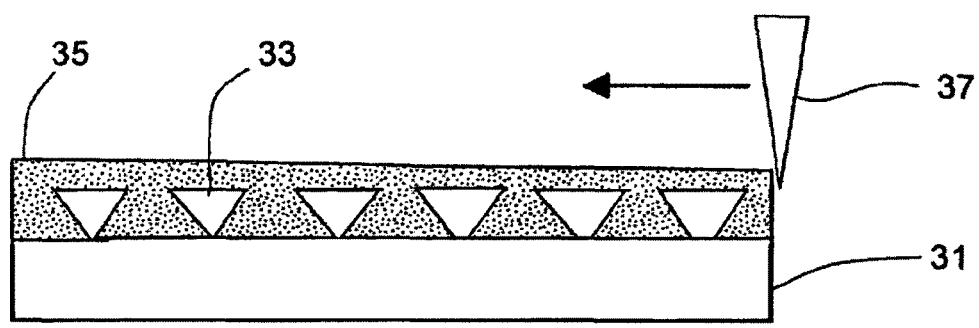

Next, by applying paste of the bump material 35 over the resist 33, the dot holes 34 are filled by the paste and surplus paste is removed by a squeegee 37 (FIG. 4B). As the bump material, slurry including metal particles are used.

Figure 4C:
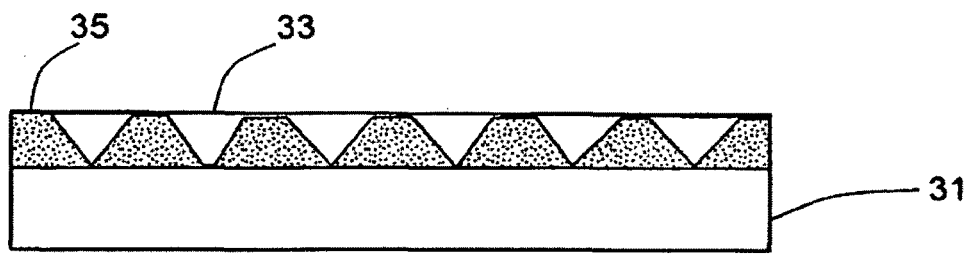
Figure 4D:
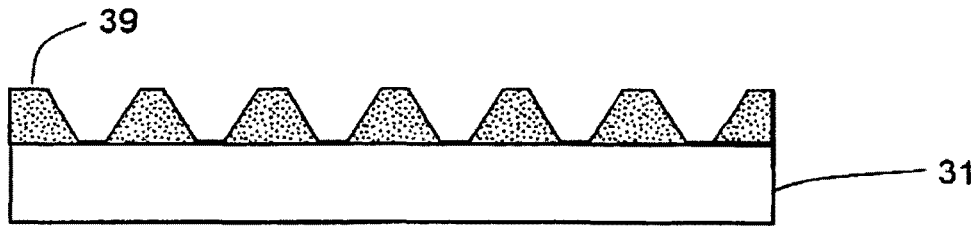

Next, the bump material 35 is culcinated for 30 minutes under 230 degrees Celsius (FIG. 4C). By this process, the metal particles in the bump material 35 are combined each other and the bumps are solidified while there are many spaces between the bumps.

Next, the resist 33 is removed and the dot bumps 39 are formed on the surface of the electrode 31. Each of the dot bumps has a conical trapezoide shape.

In the first exemplary embodiment, the bumps have a height of 2 μm, a bottom diameter of 3 μm, an upper diameter of 1 μm, and the pitch (distance between the axes of the conical shape adjacent bumps) of 5 μm.

Figure 5A:
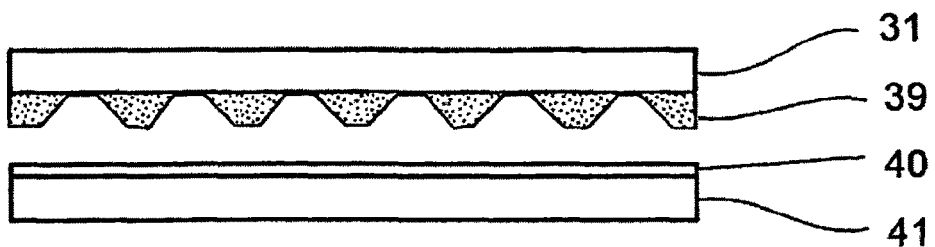
FIGS. 5A and 5D show a bonding process between the semiconductor light emitting element and the board with the bump according to the first exemplary embodiment.
Figure 5B:
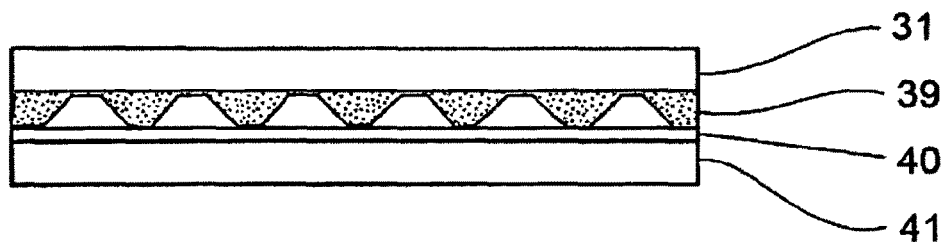
Figure 5C:
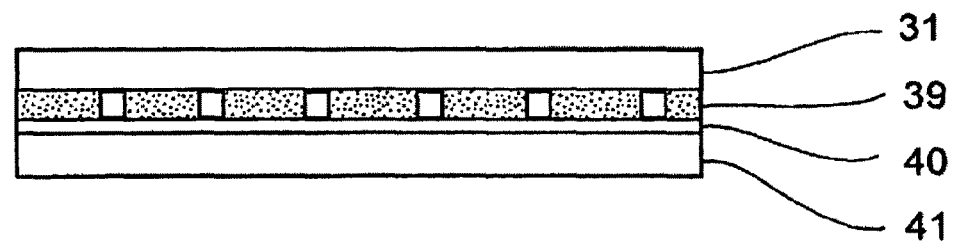
Figure 5D:
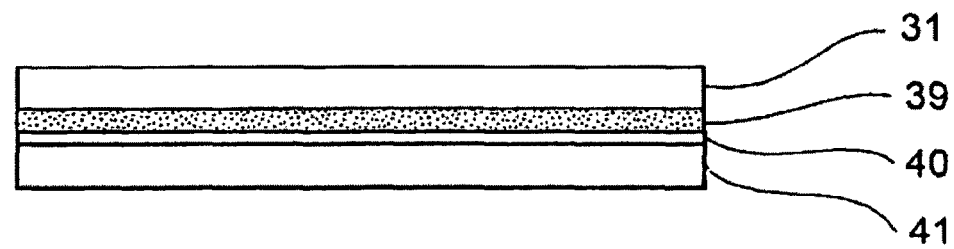

As shown in FIGS. 5A and 5B, the electrode 31 of the semiconductor light emitting element is abutted to the wiring board 40 while the bumps 39 are formed on the electrode 31. The wiring board 40 is mounted on a base 41. After that, the semiconductor light emitting element and the wiring board 40 are hot pressed under 230 degrees Celsius and the bumps 39 deform. At this time, since the bumps 39 has a conical trapezoid shape, stress is concentrated on the top surface (the small area portion) and deforms therefrom. Since the shape of the bumps 39 is uniform, the deformation of the bumps 39 is also uniform. Therefore, it is possible to fill the bumps 39 between the electrode 31 and the wiring board 40 without spaces (FIGS. 5C and 5D).

Accordingly, the bonding between the electrode 31 of the semiconductor light emitting element and the wiring board 40 is imparted stable and sufficient strength, and the heat dissipation characteristics of the semiconductor light emitting element is sufficient.

Second Exemplary Embodiment

Figure 6B:
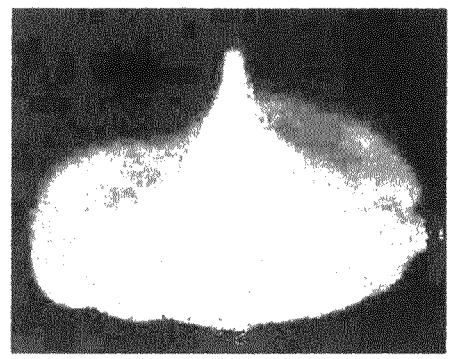
FIG. 6B is an expanded perspective view of the bump of FIG. 6A.
Figure 6C:
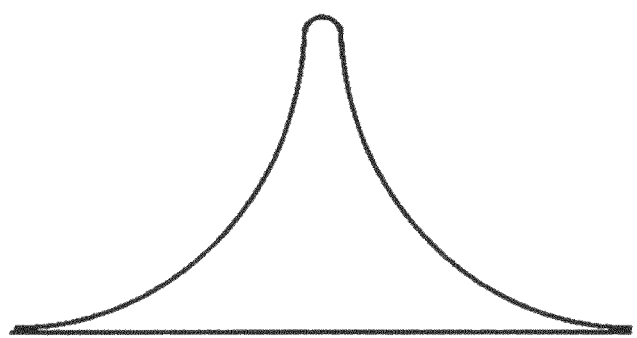
FIG. 6C is a side view of the bump in FIG. 6A.
Figure 7A:
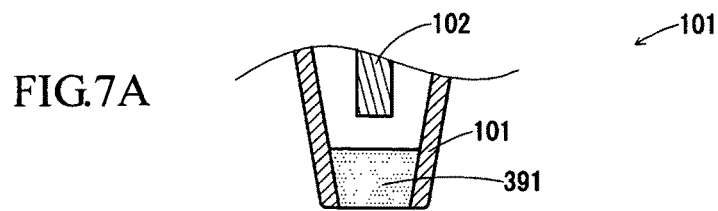
FIGS. 7 A to 7E show a manufacturing process for the bump material body 390.

The second exemplary embodiment of the present invention is explained below with reference to the drawings. In the second exemplary embodiment, the bump material bodies 390 are formed on the surface of the electrode 31 of the semiconductor light emitting element by needle application. FIG. 6A shows the surface of the electrodes (P-electrode 15 and N-electrode 17) under the bump formation. FIG. 6B is an expanded perspective view of the bump material body 390 and FIG. 6C is a side view of the bump material body 390. As shown in FIG. 6A, the bump material bodies 390 are formed on the surface of the electrodes 15 and 17 in a dot array manner. For example, the needle type dispenser 100 (Applied Micro Systems Inc.) may be used for forming the bump material bodies 390. FIGS. 7A to 7E show a manufacturing process for the bump material bodies 390 by the dispenser device 100. As shown in FIG. 7A, the dispenser device 100 is provided with a glass tube 101 having an opening at a tip thereof, and a tungsten needle 102. The bump material 391 is held at the opening by the surface tension of the bump material 391.

Figure 7B:
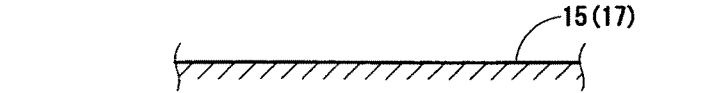
Figure 7C:
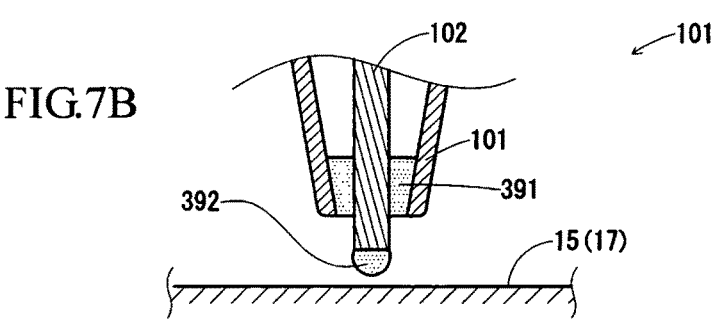
Figure 7D:
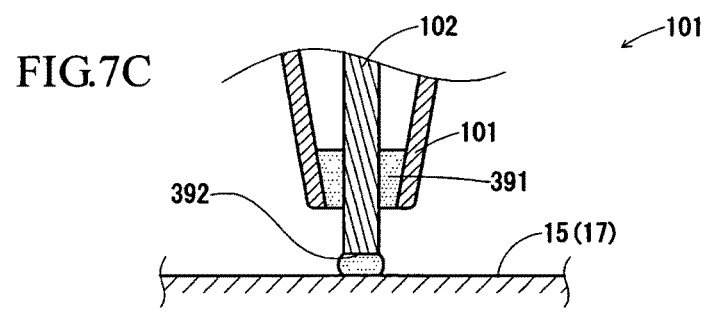
Figure 7E:
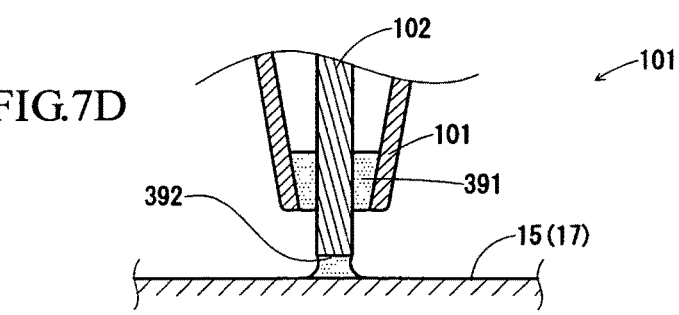

The bump material bodies 390 are formed as explained below. Firstly, the glass tube 101 is set at a predetermined position over the electrode 15, and the tungsten needle 102 descends so as to pass the bump material 391 held at the tip of the glass tube 101 (FIG. 7B). In this way, the bump material 391 adheres at the tip of the needle 102. Then, the needle 102 descends further so as to contact the bump material 391 to the surface of the electrode 15 (FIG. 7C). After that, the needle 102 ascends (FIG. 7D). Accordingly, the bump material body 390 is formed by transfer printing the bump material 391 on the surface of the electrode 15 (FIG. 7E). Thus formed bump material bodies 390 have a shape which gradually reduces its width along its height as being distant from the surface of the electrode 15. Therefore, the side surface of the bump material bodies 391 inclines. Each of the bump material bodies 390 has the height of 50 μm, the bottom diameter of 50 μm. The bump material bodies 390 have same shape and are arranged on the surface of the electrodes 15 and 17 with pitch of 5 μm (pitch is distance between the center line of adjacent bump material bodies).

Since the width of the bump material bodies shorten along the height direction, stress concentrates on the portion with the small width and deformation starts therefrom as same as the first exemplary embodiment. Since the shape of the bump material bodies 390 is uniform, the deformation of the bump material bodies 390 is also uniform. Therefore, it is possible to fill the bump material bodies 390 between the electrodes 15, 17 and the wiring board 40 without spaces. Also, since the tiny drop application device 100 is used, workability is improved as compared to the case where the resist is used.

In the above described second exemplary embodiment, the bump material bodies 390 are arranged on the surface of the N-electrode 15 and P-electrode 17 of the semiconductor light emitting element in a dot array manner. Instead, as shown in FIG. 8, it is possible to form the bump material bodies 390 on the P-electrode 17 in a stripe shape. The stripe shape bump material bodies 390 may be formed by reducing the pitch of transfer printing of the bump material by the tiny drop application device 100 along the longitudinal direction of the stripe shape so that the dot bump material bodies 390 is combined along the longitudinal direction.

Third Exemplary Embodiment

Figure 9A:
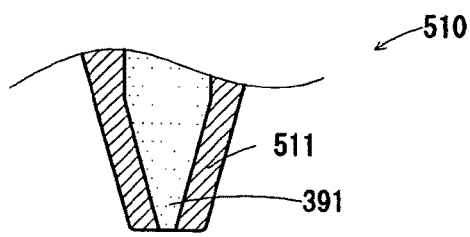
FIGS. 9A to 9D show a process forming a bump material body 500 in the third embodiment of the present invention.
Figure 9B:
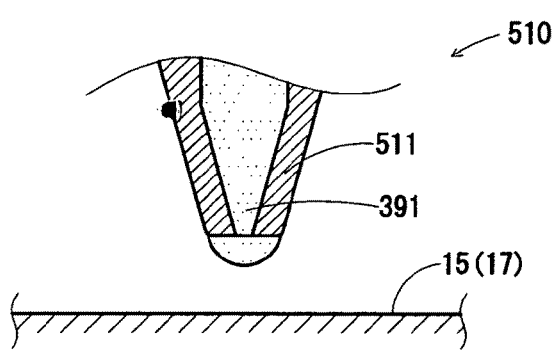

The third exemplary embodiment of the present invention is explained below with reference to the drawings. FIGS. 9A to 9D show a surface of the electrode (P-electrode 15 or N-electrode 17) while the bump material body 500 is formed. The bump material body 500 is formed on the surface of the electrodes of the semiconductor light emitting element by, for example, an air-pulse dispenser (Musashi Engineering Inc.). FIGS. 9A to 9D also show the process to form the bump material body 500 by the dispenser 510. As shown in FIG. 9A, the dispenser 510 includes a syringe provided with a nozzle 511 at the tip thereof. The nozzle 511 has a circular opening at the tip thereof and the inner diameter of the opening is about 50 μm and the outer diameter of the opening is about 80 μm. The inside of the nozzle is filled by the bump material 391 and the bump material 391 is discharged from the opening.

Figure 9C:
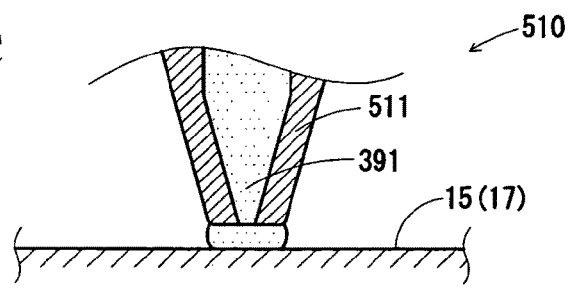
Figure 9D:
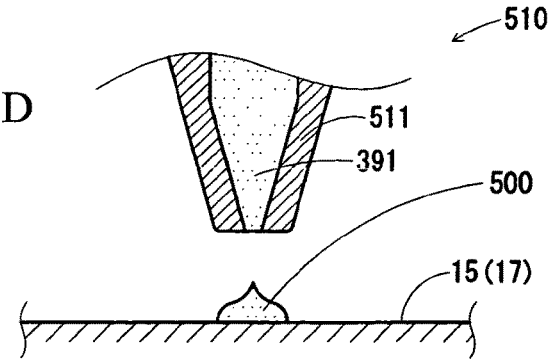

The bump material body 500 is formed by the manner explained below. At first, the nozzle 511 is set at a predetermined position above the electrode 15 (FIG. 9A) and the bump material 391 is discharged from the opening of the nozzle 511 (FIG. 9B) so as to contact the bump material 391 onto the surface of the electrode 15 (FIG. 9C). After that, the nozzle 511 ascends (FIG. 9D) and the bump material 391 is transfer printed onto the surface of the electrode 15. In this exemplary embodiment, the bump material 391 is discharged under the condition that the discharging pressure of 200 KPa and the discharging time 0.03 seconds. Such discharge condition can be determined depending on the viscosity of the bump material 391 or the like.

After forming the bump material body 500, a provisional calcination is performed under the condition that the temperature of 200 degrees Celsius and the calcination time is 10 minutes. By this provisional calcination, the solvent in the bump material body 500 evaporates and the metal particles in the bump material body 500 are combined with each other in the presence of a lot of spaces therebetween (provisional fusion) and are provisionally combined with the electrode 15. Accordingly, the bump material body 500 is fixed to the electrode 15 and becomes easily deformable.

The shape of the bump material body 500 has a width gradually reducing along the height direction thereof while distant from the surface of the electrode 15 (tapered shape). Therefore, the side surface of the bump material body 500 inclines. In this exemplary embodiment, the height of the bump material body 500 is 50 μm and the diameter of the bottom surface of the bump material body 500 is 50 μm. The bump material body 500 is arranged on the surface of the electrodes 15 and 17 in about 5 μm pitch (distance between the central axes of adjacent bump material bodies) as same as the bump material body 390 of the second exemplary embodiment.

In the third exemplary embodiment, the dispenser 510 provided with the nozzle 511 which has a circular opening at the tip thereof, is described as an example. Instead, for example, a dispenser provided with a nozzle which has a rectangular opening. By using such a dispenser with rectangular opening, bump material bodies which have a rectangular bottom surface can be formed and it is possible to arrange the bump material bodies more densely as compared to the bump material bodies with circular bottom surface.

In the third exemplary embodiment, the nozzle having the opening whose inner diameter is 50 μm is used. Instead, for example, a nozzle having an opening whose inner diameter is 20 μm. Accordingly, bump material bodies whose bottom surface is 20 μm diameter circle can be formed and it is possible to arrange the bump material bodies more densely.

While the present invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A manufacturing method of a mounting part of a semiconductor light emitting element, the method comprising:
   preparing a semiconductor light emitting element including an electrode which comprises a surface and a board, said board comprising a surface;
   forming a plurality of bump material bodies on at least one of the surface of the electrode and the surface of the board by shaping a bump material into islands, wherein the bump material comprises a paste, said paste comprising metal particles dispersed therein, an area of a top surface and an area of a bottom surface of the bump material bodies being different from each other, and the top surface is practically flat;
   solidifying the bump material bodies by thermally processing the bump material bodies; and
   fixing the semiconductor light emitting element and the board through the bump material bodies,
   wherein the plurality of the bump material bodies are formed with a mask covering at least one of the surface of the electrode and the surface of the board,
   wherein the mask includes a plurality of openings are tapered in a thickness direction of the mask, and
   wherein the bump material is filled into the tapered openings.

2. The manufacturing method according to claim 1, the mask comprises a resist.

3. The manufacturing method according to claim 2, wherein the bump material is filled into the tapered openings from an upper surface of the mask by screen printing.

4. The manufacturing method according to claim 1, wherein the bump material bodies deform and combine with each other while fixing the semiconductor light emitting element and the board through the bump material bodies.

5. The manufacturing method according to claim 1, wherein a shape of the bump material bodies is conical trapezoid and the bump material bodies are uniformly arranged on the surface of the electrode of the semiconductor light emitting element.

6. The manufacturing method according to claim 1, wherein the bump material include a thermoplastic sealant, and
   wherein said method further comprises sealing the semiconductor light emitting element by hot pressing the semiconductor light emitting element and the board.

7. The manufacturing method according to claim 6, wherein the thermoplastic sealant comprises a low-melting-point glass.

* * * * *